United States Patent [19]

O'Neill et al.

[11] Patent Number: 5,212,618

[45] Date of Patent: May 18, 1993

[54] ELECTROSTATIC DISCHARGE CLAMP USING VERTICAL NPN TRANSISTOR

[75] Inventors: Dennis P. O'Neill, San Mateo County; William C. Rempfer; Robert C. Dobkin, both of Santa Clara County, all of Calif.

[73] Assignee: Linear Technology Corporation, Milpitas, Calif.

[21] Appl. No.: 518,151

[22] Filed: May 3, 1990

[51] Int. Cl.$^5$ .................... H02H 9/04; H02L 27/04
[52] U.S. Cl. .................................. 361/56; 361/91; 257/356
[58] Field of Search .............. 361/56, 91; 357/23.13

[56] References Cited

U.S. PATENT DOCUMENTS

| | | | |
|---|---|---|---|
| 3,230,429 | 1/1966 | Stehney | 361/56 |
| 3,967,295 | 6/1976 | Stewart | 357/23.13 |
| 4,106,048 | 8/1978 | Khajezadeh | 361/56 |
| 4,131,908 | 12/1978 | Daub et al. | 357/23.13 |
| 4,367,509 | 1/1983 | Snyder et al. | 361/91 |
| 4,400,711 | 8/1983 | Avery | 361/56 |
| 4,543,593 | 9/1985 | Fujita | 361/91 |
| 4,567,500 | 1/1986 | Avery | 361/56 |
| 4,573,099 | 2/1986 | Ganesan et al. | 361/56 |
| 4,652,902 | 3/1987 | Takata et al. | 357/23.13 |
| 4,656,491 | 4/1987 | Igarashi | 357/23.13 |
| 4,937,471 | 6/1990 | Park et al. | 357/23.13 |
| 4,939,616 | 7/1990 | Rountree | 361/56 |
| 4,990,802 | 2/1991 | Smooha | 357/23.13 |
| 5,010,380 | 4/1991 | Avery | 357/23.13 |
| 5,027,181 | 6/1991 | Larik et al. | 361/56 |
| 5,099,302 | 3/1992 | Pavlin | 357/23.13 |
| 5,159,518 | 10/1992 | Roy | 361/91 |

FOREIGN PATENT DOCUMENTS

| | | |
|---|---|---|
| 269946 | 7/1989 | German Democratic Rep. . |
| 2-214164 | 8/1990 | Japan . |
| 2090701 | 7/1982 | United Kingdom ............ 357/23.13 |
| 2127214 | 4/1984 | United Kingdom . |
| 2210197 | 6/1989 | United Kingdom . |

Primary Examiner—Geoffrey S. Evans
Attorney, Agent, or Firm—Flehr, Hohbach, Test, Albritton & Herbert

[57] ABSTRACT

An electrostatic discharge protection clamp particularly useful for with bipolar and biCMOS integrated circuits include an NPN transistor formed in an isolated tub in an epitaxial layer grown on a substrate. The collector of the NPN transistor is connected to the input terminal, and the emitter of the NPN transistor is connected to the substrate. A resistor interconnects the base and the emitter. Advantageously, the P-doped base can abut the P-doped isolation region forming the tub, and the P-doped isolation region can interconnect the emitter to the substrate. Below $BV_{CES}$ the clamp will look like an open circuit, and above $BV_{CES}$ the transistor will start conducting current. The transistor will break down collector to base. Conduction of the transistor causes a voltage drop across the base-emitter junction, and when this voltage drop exceeds the base-emitter forward voltage the transistor will turn on. Once the transistor is turned on and current starts flowing in the emitter, avalanche effects will cause the breakdown voltage to snap back to $BV_{CEO}$ and remain there until the emitter current drops below some low level, which will be at the end of the electrostatic discharge pulse. In the negative direction the tub to substrate diode provides an effective clamp which will clamp the voltage to a low value and limit the power dissipation in the junction. Alternatively, a bidirectional clamp can be provided in which a second NPN transistor is fabricated in the tub with the emitter of the second transistor connected to the input terminal and the collectors of the two transistors being interconnected by the N-doped epitaxial layer of the tub. The dopant conductivities can be reversed.

21 Claims, 4 Drawing Sheets

ELECTROSTATIC DISCHARGE CLAMP USING VERTICAL NPN TRANSISTOR

BACKGROUND OF THE INVENTION

This invention relates generally to electrostatic discharge clamps, and more particularly to a voltage clamp employing a vertical NPN transistor structure.

The input terminals to bipolar circuits must be provided with electrostatic discharge clamps in order to protect the bipolar circuitry, especially sensitive input structures. The human body, for example, can be modeled as a charged 100 PF capacitor in series with a 1.5 K ohm resistor with capacitor voltages sometimes exceeding 10 KV. Thus, a human body can provide peak voltage and current sufficient to damage circuits designed to operate at a low voltage level.

Protection against electrostatic discharge voltages is conventionally provided by placing or connecting input terminals to a negative doped region, in a semiconductor substrate which has a positive dopant concentration. The resulting PN junction, or diode, will clamp the input terminal to a low negative voltage relative to the substrate value by discharging a large negative voltage to the substrate. This is much less effective for positive electrostatic discharge voltages, however, because the reverse biased diode is less capable of clamping at a voltage low enough to prevent damage. To be useful, electrostatic discharge circuits must clamp well in both directions.

Protection against voltage discharge has heretofore been provided in MOS circuits by connecting the input terminal to a lateral NPN transistor. This invention is directed to a novel clamp particularly useful with bipolar circuits and biCMOS circuits and which can be effective for positive and negative electrostatic discharge voltages.

SUMMARY OF THE INVENTION

An object of the present invention is to provide an improved electrostatic discharge clamp.

Another object of this invention is to provide an improved clamp which is effective for both positive and negative electrostatic discharge.

Still another object of the invention is to provide an electrostatic discharge clamp which is particularly useful with bipolar and biCMOS circuits.

One feature of the invention is an electrostatic discharge clamp including a vertical NPN transistor which can clamp an input terminal to $BV_{CEO}$ of the transistor after a voltage exceeding $BV_{CES}$ of the transistor is applied to the terminal. Below $BV_{CEO}$ the clamp appears as an open circuit.

The vertical NPN transistor is fabricated in an N-doped region formed in a P-doped substrate. The transistor is in parallel with a diode formed by the region and substrate. The base and emitter of the transistor are interconnected by a resistance, which can be the resistance of the base region.

In operation, the clamp will break down collector to base to limit positive electrostatic discharge. Below $BV_{CES}$ the clamp will look like an open circuit. Above $BV_{CES}$ the transistor will start conducting current because the transistor breaks down from collector to base. The geometry of the transistor is such that at least part of the breakdown current flows through the base resistance thereby causing a voltage drop across the base resistance. The emitter is placed near the end of the base which will be at the highest potential, and the emitter is shorted to the end of the base which is at the lower potential. When this voltage drop exceeds the base-emitter forward voltage, the transistor will turn on. Once the transistor is on and current flows in the emitter, avalanche effects will cause breakdown voltage to snap back to $BV_{CEO}$ and remain there until the emitter current drops back to some low level, which will happen at the end of the electrostatic discharge pulse. Accordingly, the clamp works by limiting the power (I.V) dissipated to a level that prevents damage.

The objects and features of the invention will be more readily understood from the following detailed description and dependent claims when taken with the drawing.

DETAILED DESCRIPTION OF ILLUSTRATIVE EMBODIMENTS

Figure 1:
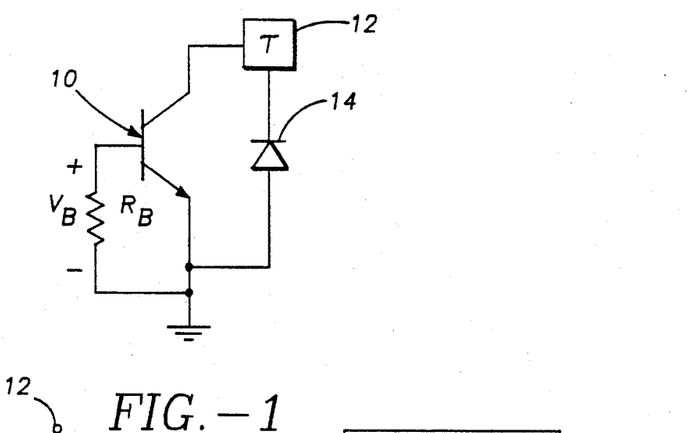
FIG. 1 is a schematic diagram of an electrostatic discharge clamp in accordance with the invention.

Referring now to the drawing, FIG. 1 is a schematic of an electrostatic discharge clamp in accordance with the invention. The clamp comprises a vertical NPN transistor 10 having its collector connected to the input terminal 12 and its emitter connected to the substrate. A resistor $R_B$ interconnects the base of the transistor and the emitter. A substrate diode 14 is connected in parallel with transistor 10 with the cathode of the diode connected to the input terminal 12 and the anode of the diode connected to the substrate. The clamp is fabricated in an N-doped tub formed in a P-doped substrate.

Figure 2A:
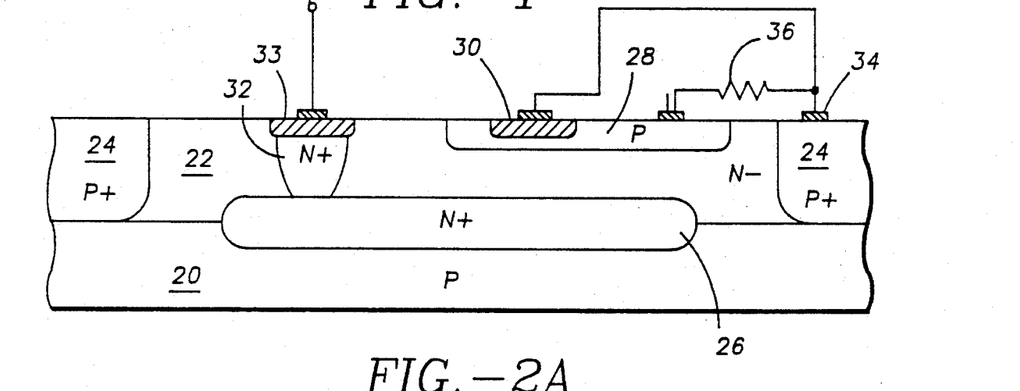
FIGS. 2A and 2B are a sectional view and a plan view respectively, of one embodiment of the clamp of FIG. 1.
Figure 2B:
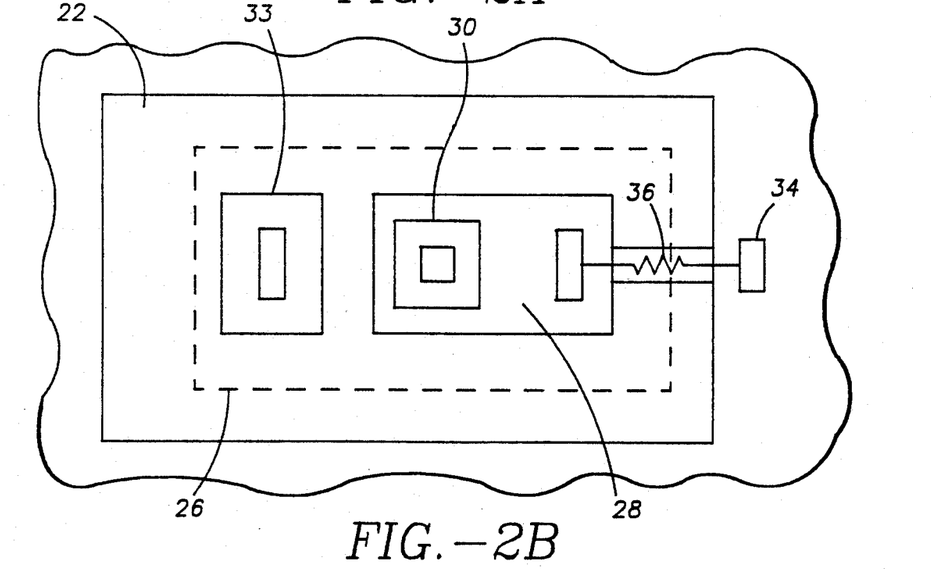

FIGS. 2A and 2B are a section view and a plan view, respectively, of one embodiment of the clamp of FIG. 1. In this embodiment a P-doped substrate 20 has a N-doped epitaxial layer 22 formed thereon. P-doped isolation regions 24 define an isolation region or tub in the epitaxial layer 22. The NPN transistor of the clamp of FIG. 1 is fabricated in the isolated tub with an N+ buried layer 26 between the substrate 20 and the isolated epitaxial layer 22 which functions as the collector, a P-doped region 28 functioning as the base, and an N+ doped region 30 functioning as the emitter. An N+ sinker 32 is formed from the surface of the epitaxial layer to the buried layer 26 to provide a low resistance surface contact to the collector. An N+ diffusion 33 is made to provide a contact surface to the sinker 32. The collector is interconnected to the input terminal (not shown), and the base and emitter are interconnected to a substrate contact 34 which can be provided on the P+ isolation region 24. The base is interconnected with the contact 34 through a resistance 36 which can be a discrete resistor fabricated on the surface of the epitaxial layer. Alternatively, the resistor can be the resistance of the base region between the emitter and the isolation region since the value of the resistor from the base of the clamp to ground is noncritical and can vary from several ohms to several hundred ohms.

Figure 3A:
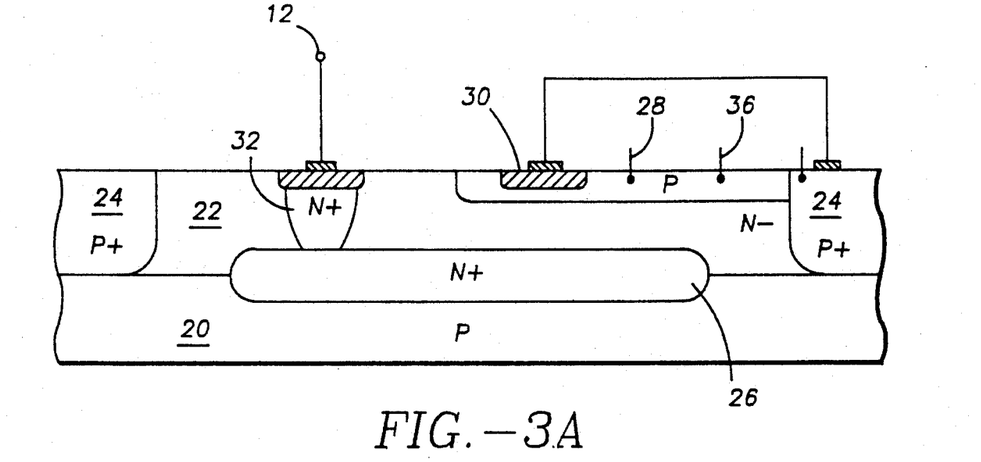
FIGS. 3A and 3B are a section view and a plan view, respectively, of another embodiment of the clamp of FIG. 1.
Figure 3B:
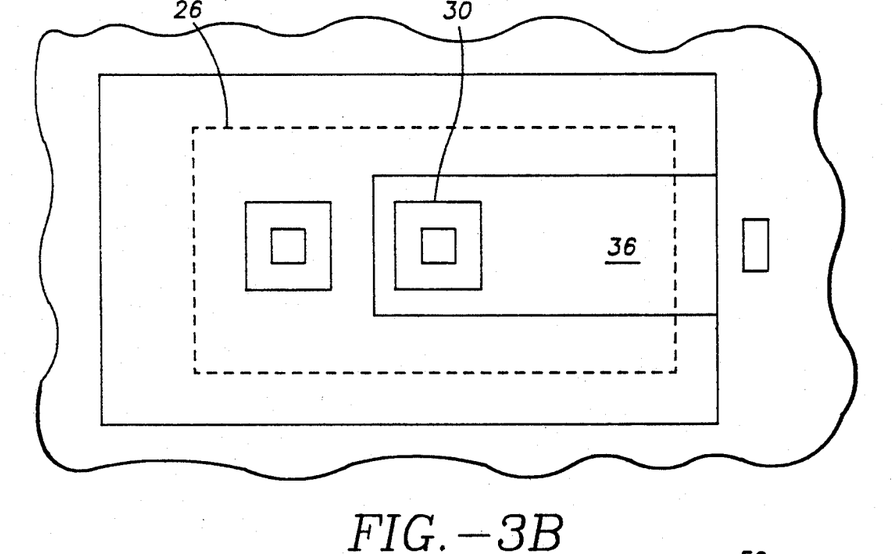

This is illustrated in FIGS. 3A and 3B which are a section view and a plan view, respectively, of another embodiment of the clamp of FIG. 1. This structure is similar to the structure of FIGS. 2A and 2B, and like elements have the same reference numerals. However, in this embodiment the base region 28 abuts the isolation region 24 with the resistance 36 provided solely by the resistance of the base region between the emitter and the isolation region 24. As long as a portion of the emitter/base junction is in the tub away from the isolation region, transistor action will occur. The base resistor now comprises the pinched resistance underneath the emitter 30 and the base resistance extending from the emitter to the isolation region.

It will be noted that the collector/base breakdown will occur first at the corners of the base, then at a slightly higher voltage, breakdown will occur et the edges of the base and finally at the bottom of the base. For the current levels which occur during an electrostatic discharge spike (i.e. several amperes) voltage drops in the base are sufficient for breakdown to occur in all three of the areas. Additionally, it will be noted that the N+ sinker to the collector helps minimize the collector resistance; hence, the voltage drop across the clamp at high currents. However, the clamp is operable at 10 KV even without the sinker.

The clamp as illustrated in FIGS. 1-3 is operable for device pins which are driven positive with respect to the substrate of the device in normal operation. In the negative direction the clamp is limited to the $V_{BE}$ of the tubsubstrate diode. Such a clamp is satisfactory for most bipolar devices; however, some inputs in bipolar devices must look like an open circuit when driven, plus or minus 30 V with respect to the substrate.

Figures 4A, 4B:
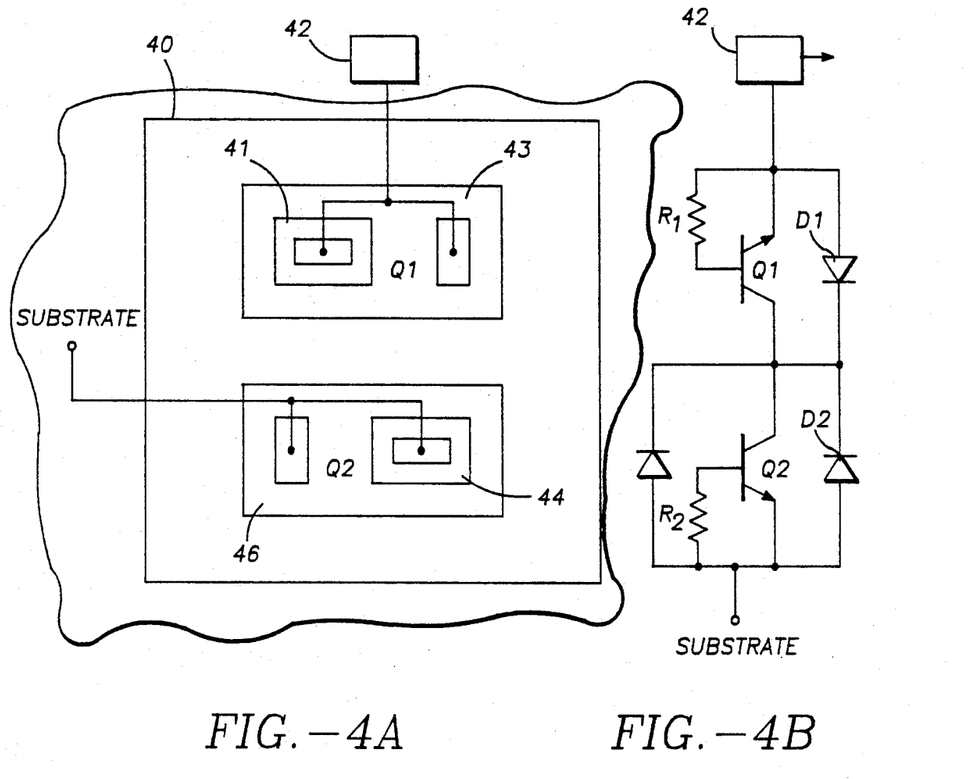
FIGS. 4A and 4B are a plan view and schematic, respectively, of a bidirectional clamp in accordance with the invention.

FIGS. 4A and 4B are a plan view and schematic, respectively, of another embodiment of the invention which is operates in both directions and allows the input pin to go ±60 V without clamping action. In this embodiment, two transistors, Q1 and Q2, are formed in z tub 40. The emitter 41 of transistor Q1 is connected to an input terminal 42 and through a small distributed base resistance R1 to the base 43 of transistor Q1. The emitter 44 of transistor Q2 is connected to ground and through a small distributed base resistance R2 to the base 46 of transistor Q2, similar to the circuitry of FIGS. 1-3. The collectors of transistors Q1 and Q2 are interconnected and comprise the N-doped tub and buried layer 40, as in the structure of FIGS. 1-3.

In operation, when the input pin is pulled positive the P-type base of transistor Q2 will forward bias to the tub, but the tub will not conduct until the voltage on the tub exceeds the $BV_{CES}$ of transistor Q2. Once the tub voltage exceeds $BV_{CES}$ of transistor Q2, transistor Q2 will turn on and an SCR can form and clamp the tub voltage to $BV_{CEO}$ or less as described above with reference to the clamps of FIGS. 1-3. In the negative direction two diodes are formed. The first diode is from the base of transistor Q2 to the tub, and since the Q2 base is tied to the substrate this diode will turn on when the tub is below the substrate by $1V_{BE}$. The second diode is the inherent substrate to tub diode which will forward bias when the tub is pulled below substrate by $1V_{BE}$. The diodes will not conduct, however, until the emitter of transistor Q1 is pulled negative with respect to the tub by a voltage greater than $BV_{CES}$ of transistor Q1. At this point transistor Q1 will turn on and an SCR can form and clamp the voltage from the tub to its emitter at $BV_{CEO}$ voltage or less. This operation is similar to the clamps of FIGS. 1-3 and the operation of the Q2 clamp for positive voltages.

Accordingly, the input pin voltage range for normal operation can be plus or minus $BV_{CES}$ (typically 60-80 V) and during an electrostatic discharge spike the input pin will be clamped to plus or minus $BV_{CEO}$ (typically 40-50 V) plus $1V_{BE}$. Other variations in the structure of the clamp transistor can be made.

Figure 5A:
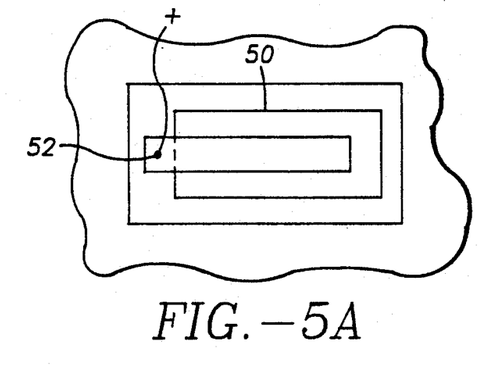
FIGS. 5A and 5B are a plan view and sectional view, respectively, of an alternative embodiment of the invention
Figure 5B:
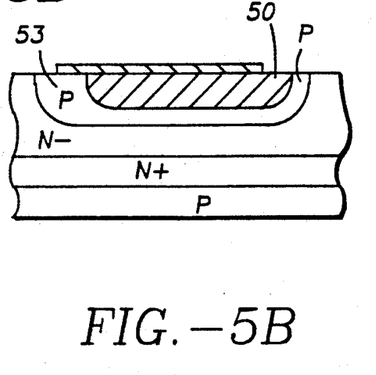

FIGS. 5A and 5B are a plan view and section view, respectively, of one embodiment in which the size of the emitter region 50 is increased. In this embodiment the breakdown current will flow from the collector region to the end of the contact 52 that is outside of the emitter region 50. Part of the current flowing into the base at the opposite end of the base must flow beneath the emitter, and in doing so will raise the potential of the base under the emitter sufficiently to forward bias the base-emitter junction and turn on the transistor.

Figure 6A:
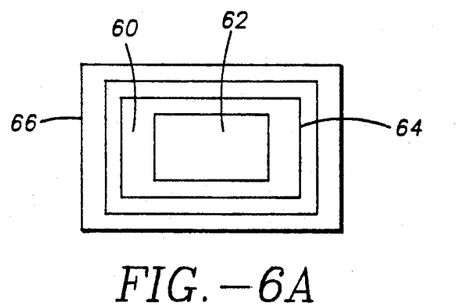
FIGS. 6A and 6B are a plan view and sectional view, respectively, of another embodiment of the invention.
Figure 6B:
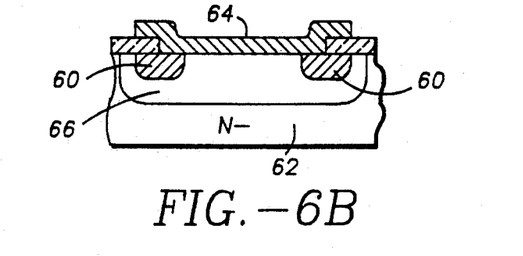

Another embodiment of the invention includes forming an opening in the center of the emitter to expose the base, as illustrated in the plan view and section view of FIGS. 6A and 6B. The emitter is 60, the opening is 62, the base is 66, and the initial contact to the base and emitter is 64. This forces all of the breakdown current from the edges of the base to flow beneath the emitter, through the pinched resistance so that the emitter/base junction forward biases evenly around its entire periphery.

Figure 7:
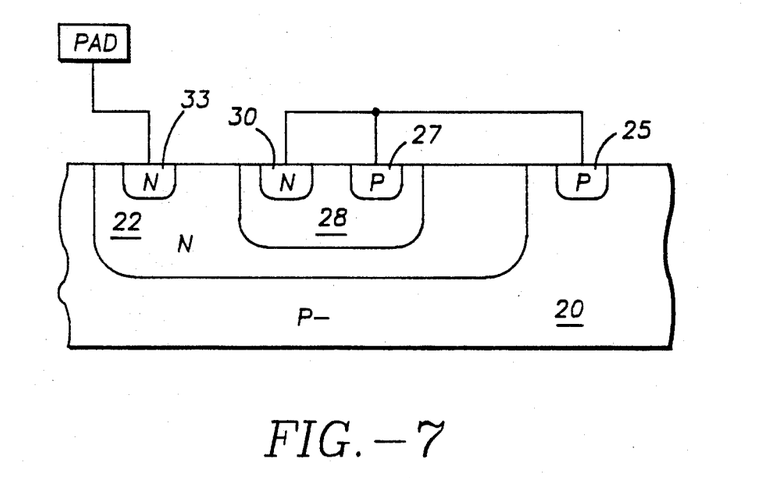
FIGS. 7 and 8 are sectional views of biCMOS circuits which are equivalent to FIGS. 2A and 4A, respectively.
Figure 8:
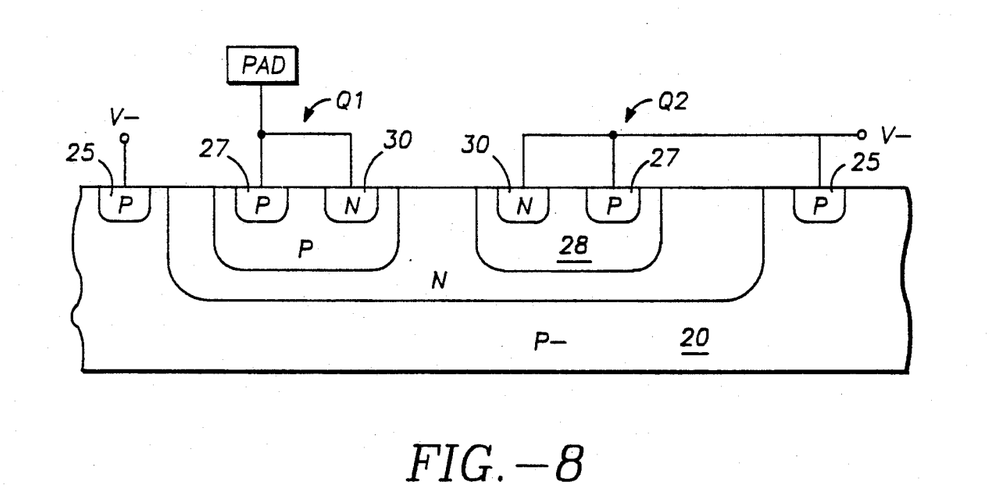

The invention has been described in bipolar embodiments with respect to FIGS. 2A-2B and 4A-4B. However, the invention is applicable in other circuits, such as biCMOS, as illustrated in the section views cf FIGS. 7 and 8. FIG. 7 is equivalent to FIG. 2A except a diffused N− well in a P-substrate is employed rather than an epitaxial layer grown on a substrate. Like elements have the same reference. P diffusions 25 and 27 serve to make contact to the lightly doped substrate 20 and base 28, respectively. Similarly, FIG. 8 is equivalent to FIG. 4A.

There has been described an improved electrostatic discharge protection clamp in which a vertical NPN transistor is used to clamp the input pin to $BV_{CEO}$ of the transistor and limit power dissipation during an ESD spike. The geometry can be arranged so that below $BV_{CES}$ the clamp is an open circuit, and above $BV_{CES}$ the breakdown current will flow in such a way as to forward bias the base-emitter junction and promote avalanche multiplication of the base current and cause the transistor to clamp at a voltage near $BV_{CEO}$ for the duration of the spike.

While the invention has been described with reference to specific embodiments, the description is illustrative of the invention and is not to be construed as limiting the invention. For example, the conductivity types can be reversed in the several illustrative embodiments. Thus, various modifications and applications may occur to those skilled in the art without departing from the true spirit and scope of the invention as defined by the appended claims.

We claim:

1. An electrostatic discharge protection clamp for an input terminal to an integrated circuit comprising:
   a semiconductor substrate of one conductivity type,
   a first semiconductor region of opposite conductive type abutting a surface of said substrate,
   a vertical bipolar transistor formed in said first semiconductor region and having emitter, base, and collector regions, with said collector region being coupled to said input terminal and diode-connected to said substrate, and with said base region being coupled to said emitter region via a current limiting resistive elements, said vertical bipolar transistor having a collector-base breakdown voltage below a pre-selected voltage level such that said vertical bipolar transistor is inactive at input voltages applied to said input terminal below the pre-selected breakdown voltage and forms a current path for discharging excess charge on said input terminal when said input voltage exceeds the pre-selected voltage level.

2. The electrostatic discharge clamp as defined by claim 1 wherein said integrated circuit comprises a bipolar circuit and wherein said transistor breakdown voltage corresponds to the breakdown voltage between said collector and base regions of said vertical bipolar transistor, said first semiconductor region being an epitaxial layer grown on said substrate.

3. The electrostatic discharge clamp as defined by claim 1 wherein said integrated circuit comprises a biCMOS circuit and wherein said transistor breakdown voltage corresponds to the breakdown voltage between said collector and base regions of said vertical bipolar transistor, said first region being a doped region in said substrate.

4. A bidirectional electrostatic discharge protection clamp for an input terminal to an integrated circuit comprising:
   a P-doped semiconductor substrate,
   an N-doped semiconductor layer grown on a surface of said P-doped semiconductor substrate,
   a P-doped isolation region extending from a surface of said N-doped layer to said substrate and surrounding a tub of said N-doped layer,
   a vertical NPN bipolar transistor formed in said tub, said transistor having a collector diode-connected to said substrate comprising said N-doped layer in said tube, a base comprising a P-doped region in said N-doped layer in said tub, and an N-doped emitter in said P-doped region, said vertical bipolar transistor having a collector-base breakdown voltage below a pre-selected voltage level such that said vertical bipolar transistor is inactive at input voltages applied to said input terminal below the pre-selected breakdown voltage and forms a current path for discharging excess charge on said input terminal when said input voltage exceeds the pre-selected voltage level,
   resistive means interconnecting said base to said emitter, and
   interconnect means connecting said collector to said input terminal.

5. The electrostatic discharge protection clamp as defined by claim 4 wherein said substrate is connected to circuit ground.

6. The electrostatic discharge protection clamp as defined by claim 4 wherein said collector further includes a buried N+ doped region between said tube and said substrate.

7. The electrostatic discharge protection clamp as defined by claim 4 wherein said base P-doped region abuts said P-doped isolation region, said resistive means comprising the resistance of said P-doped region.

8. The electrostatic discharge protection clamp as defined by claim 4 wherein said N-doped emitter has a central opening exposing said base.

9. An electrostatic discharge protection clamp for an input terminal to an integrated circuit comprising:
   a P-doped semiconductor substrate,
   an N-doped epitaxial semiconductor layer grown on a surface of said P-doped semiconductor substrate,
   a P-doped isolation region extending from a surface of said epitaxial layer to said substrate and surrounding a tub of said epitaxial layer,
   a vertical NPN transistor formed in said tub, said transistor having a collector comprising said N-doped epitaxial layer in said tube and a buried N+ doped region between said tub and said substrate, a base comprising a P-doped region in said N-doped epitaxial layer in said tub, and an N-doped emitter in said P-doped region,
   an n+ region extending between the surface of said tub and the N+ buried region to provide contact from the surface to the buried region,
   resistive means interconnecting said base to said emitter,
   first interconnect means connecting said collector to an input terminal, and
   second interconnect means connecting said emitter to said substrate.

10. The electrostatic discharge protection clamp as defined by claim 9 wherein said base and emitter are connected to said substrate through said P-doped isolation region.

11. The electrostatic discharge protection clamp as defined by claim 10 wherein said base P-doped region abuts said P-doped isolation region, said resistive means comprising the resistance of said P-doped region.

12. A bidirectional electrostatic discharge protection clamp for an input terminal to an integrated circuit, said protection clamp being disposed to prevent first and second preselected electrostatic discharge voltages of first and second polarities impressed upon said input terminal from exceeding first and second breakdown voltages characteristic of first and second vertical bipolar transistors, respectively, comprising:
   a semiconductor substrate of one conductivity type,
   a first semiconductor region of opposite conductivity type abutting a surface of said substrate,
   first and second vertical bipolar transistors formed in said first semiconductor region, each of said transistors having an emitter, a base, a collector, and an input terminal, said first and second vertical bipolar transistors being inactive at input voltages applied to said input terminal below the first and second pre-selected voltages, respectively, and forming first and second current paths for discharging excess charge on said input terminal when said input voltage exceeds the first pre-selected voltages, respectively,
   first interconnect means connecting said emitter of said first transistor to said input terminal,
   first resistive means connecting said base of said first transistor to said input terminal,
   second interconnect means connecting said emitter of said second transistor to said substrate, and second resistive means connecting said base of said second transistor to said substrate.

13. The electrostatic discharge clamp as defined by claim 12 wherein said integrated circuit comprises a bipolar circuit and wherein said first and second transistor breakdown voltages respectively correspond to the breakdown voltages between said collector and base regions of said first and second vertical bipolar transistors, said first semiconductor region being an epitaxial layer grown on said substrate.

14. The electrostatic discharge clamp as defined by claim 12 wherein said integrated circuit comprises a biCMOS circuit and wherein said first and second transistor breakdown voltages respectively correspond to the breakdown voltages between said collector and base regions of said first and second vertical bipolar transistors, said first region being a doped region in said substrate.

15. A bidirectional electrostatic discharge protection clamp for an input terminal to an integrated circuit, said protection clamp being disposed to prevent electrostatic discharge voltages of first and second polarities impressed upon said input terminal from exceeding first and second breakdown voltages characteristic of first and second vertical bipolar transistors, respectively, comprising:
- a P-doped semiconductor substrate,
- an N-doped layer grown on a surface of said P-doped semiconductor substrate,
- a P-doped isolation region extending from a surface of said N-doped layer to said substrate and surrounding a tub of said N-doped layer,
- first and second NPN bipolar transistors formed in said tub, each of said transistors having a collector diode-connected to said substrate comprising said N-doped layer in said tub, each of said transistors having a base comprising P-doped regions in said N-doped layer in said tub, and each of said transistors having an N-doped emitter in one of said P-doped regions wherein said first and second bipolar transistors have collector-base breakdown voltages such that said transistors are inactive at input voltages applied to said input terminal below the first and second breakdown voltages, respectively,
- interconnect means connecting said emitter of said first transistor to said input terminal, first resistive means connecting said base of said first transistor to said input terminal, and
- second resistive means connecting said base of said second transistor to said substrate.

16. The bidirectional electrostatic discharge protection clamp as defined by claim 15 wherein said substrate is connected to circuit ground and said base and said emitter of said second transistor are connected to said substrate.

17. The bidirectional electrostatic discharge protection clamp as defined in claim 16 wherein said base and emitter of said second transistor are connected to said substrate through said P-doped isolation region.

18. The bidirectional electrostatic discharge protection clamp as defined by claim 17 wherein said base P-doped region of said second transistor abuts said P-doped isolation region, said resistive means comprising the resistance of said P-doped region.

19. The bidirectional electrostatic discharge protection clamp as defined by claim 18 wherein said collectors further include a buried N+ doped region between said tub and said substrate.

20. A bidirectional electrostatic discharge protection clamp for an input terminal to an integrated circuit comprising:
- a P-doped semiconductor substrate connected to circuit ground,
- an N-doped epitaxial layer grown on a surface of said P-doped semiconductor substrate,
- a P-doped isolation region extending from a surface of said epitaxial layer to said substrate and surrounding a tub of said epitaxial layer,
- first and second NPN bipolar transistors formed in said tub, each of said transistors having a collector comprising said N-doped layer in said tub wherein said collectors further include a buried N+ doped region between said tub and said substrate, each of said transistors having a base comprising P-doped regions in said N-doped epitaxial layer in said tub wherein said base P-doped region of said second transistor abuts said P-doped isolation region, and each of said transistors having an N-doped emitter in one of said P-doped regions wherein said base and wherein said base and said emitter of said second transistor are connected to said substrate through said P-doped isolation region,
- an n+ region extending between the surface of said tub and the N+ buried region to provide contact from the surface to the buried region,
- an input terminal,
- first interconnect means connecting said emitter of said first transistor to said input terminal,
- first resistive means connecting said base of said first transistor to said input terminal, said first resistive means comprising the resistance of said P-doped region,
- second interconnect means connecting said emitter of said second transistor to said substrate, and
- second resistive means connecting said base of said second transistor to said substrate, said resistive means comprising the resistance of said P-doped region.

21. An electrostatic discharge protection clamp for an input terminal to an integrated circuit comprising:
- a semiconductor substrate of one conductivity type,
- a first semiconductor region of opposite conductive type abutting a surface of said substrate,
- a vertical bipolar transistor formed in said first semiconductor region and having emitter, base, and collector regions, with said collector region being coupled to said input terminal and said base region being coupled to said emitter region via a current limiting resistive element, said vertical bipolar transistor having a collector-base voltage below a pre-selected voltage level such that said vertical bipolar transistor is inactive at input voltages applied to said input terminal below the pre-selected breakdown voltage and forms a current path for discharging excess charge on said input terminal when said input voltage exceeds the pre-selected voltage level, and
- a PN junction connecting said substrate to said collector region.

* * * * *

UNITED STATES PATENT AND TRADEMARK OFFICE
CERTIFICATE OF CORRECTION

PATENT NO. : 5,212,618

DATED : May 18, 1993

INVENTOR(S) : O'Neill et al.

It is certified that error appears in the above-identified patent and that said Letters Patent is hereby corrected as shown below:

TITLE PAGE

In the abstract, line 2, delete "with".

In the abstract, line 3, change "include" to --includes--.

At column 3, line 39, change "tubsubstrate" to --substrate--.

At column 3, line 47, delete "z".

At column 3, line 58, change "Q2" to --Q1--.

At column 5, line 12, change "elements" to --element--.

At column 5, line 13, delete "below" and insert --above--.

At column 5, line 47, change "tube" to --tub--.

At column 5, line 51, delete "below" and insert --above--.

At column 5, line 67, change "tube" to --tub--.

At column 6, line 18, change "tube" to --tub--.

At column 6, line 43, change "voltages" to --voltage--.

At column 6, line 43, change "characteristic" to --characteristics--.

At column 6, line 61, after "first" insert --and second--.

At column 7, line 25, change "voltages" to --voltage--.

At column 7, line 25, change "characteristic" to --characteristics--.

At column 8, line 26, delete "and wherein said base".

UNITED STATES PATENT AND TRADEMARK OFFICE
CERTIFICATE OF CORRECTION

PATENT NO. : 5,212,618
DATED : May 18, 1993
INVENTOR(S) : O'Neill et al.

It is certified that error appears in the above-indentified patent and that said Letters Patent is hereby corrected as shown below:

At column 8, line 56, delete "below" and insert --above--.

Signed and Sealed this

Thirteenth Day of September, 1994

Attest:

BRUCE LEHMAN

*Attesting Officer*     *Commissioner of Patents and Trademarks*